United States Patent
Leggette et al.

(10) Patent No.: US 10,216,444 B2
(45) Date of Patent: Feb. 26, 2019

(54) REQUESTER SPECIFIED TRANSFORMATIONS OF ENCODED DATA IN DISPERSED STORAGE NETWORK MEMORY

(71) Applicant: International Business Machines Corporation, Armonk, NY (US)

(72) Inventors: Wesley B. Leggette, Chicago, IL (US); Jason K. Resch, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/353,024

(22) Filed: Nov. 16, 2016

(65) Prior Publication Data
US 2017/0153937 A1  Jun. 1, 2017

Related U.S. Application Data

(60) Provisional application No. 62/260,743, filed on Nov. 30, 2015.

(51) Int. Cl.
*G06F 11/00* (2006.01)
*G06F 3/06* (2006.01)
(Continued)

(52) U.S. Cl.
CPC .......... *G06F 3/0635* (2013.01); *G06F 3/064* (2013.01); *G06F 3/067* (2013.01); *G06F 3/0611* (2013.01); *G06F 3/0617* (2013.01); *G06F 3/0619* (2013.01); *G06F 3/0659* (2013.01); *G06F 11/0727* (2013.01); *G06F 11/1076* (2013.01);
(Continued)

(58) Field of Classification Search
None
See application file for complete search history.

(56) References Cited

U.S. PATENT DOCUMENTS 4,092,732 A  5/1978 Ouchi
5,454,101 A  9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Daniel F. McMahon
(74) *Attorney, Agent, or Firm* — Garlick & Markison; Timothy W. Markison; Timothy D. Taylor

(57) ABSTRACT

A method for execution by a computing device of a dispersed storage network (DSN). The method begins by receiving a data access request that includes a requested return data format, regarding a set of encoded data slices. The method continues with determining whether the requested return data format is a valid format and when valid, issuing data access requests to storage units of the DSN. When a decode threshold number of encoded data slices of the set of encoded data slices are received from the storage units, the method continues by decoding the encoded data slices to recover a data segment and determining whether a data type of the data segment is consistent with the requested return data format. When the data type of the data segment is consistent, the method continues by formatting the recovered data segment and sending the formatted and received data segment to the requested device.

14 Claims, 8 Drawing Sheets

(51) Int. Cl.
    *G06F 11/10*     (2006.01)
    *G06F 11/07*     (2006.01)
    *G06F 17/30*     (2006.01)
    *H04L 29/08*     (2006.01)
    *H03M 13/15*     (2006.01)
    *H03M 13/00*     (2006.01)
    *H04L 12/18*     (2006.01)

(52) U.S. Cl.
    CPC .... *G06F 11/1092* (2013.01); *G06F 17/30569* (2013.01); *H03M 13/1515* (2013.01); *H03M 13/616* (2013.01); *H04L 12/18* (2013.01); *H04L 67/1008* (2013.01); *H04L 67/1097* (2013.01); *H04L 67/2823* (2013.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll, Jr. |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters, III et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2011/0072210 A1* | 3/2011 | Dhuse ................ G06F 11/1076 711/114 |
| 2011/0314072 A1* | 12/2011 | Resch ................... H04L 63/06 707/827 |
| 2012/0030371 A1* | 2/2012 | Baptist .................. H04L 63/08 709/236 |
| 2013/0086452 A1* | 4/2013 | Grube ............... H03M 13/3761 714/763 |
| 2013/0283094 A1* | 10/2013 | Baptist ............... H04L 67/1097 714/6.2 |
| 2014/0351632 A1* | 11/2014 | Grube ................ G06F 11/1092 714/6.24 |
| 2014/0380120 A1* | 12/2014 | Grube ............... H03M 13/3761 714/763 |
| 2014/0380124 A1* | 12/2014 | Grube .................. H04W 12/00 714/764 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network VVorking Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

(56) References Cited

OTHER PUBLICATIONS

Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

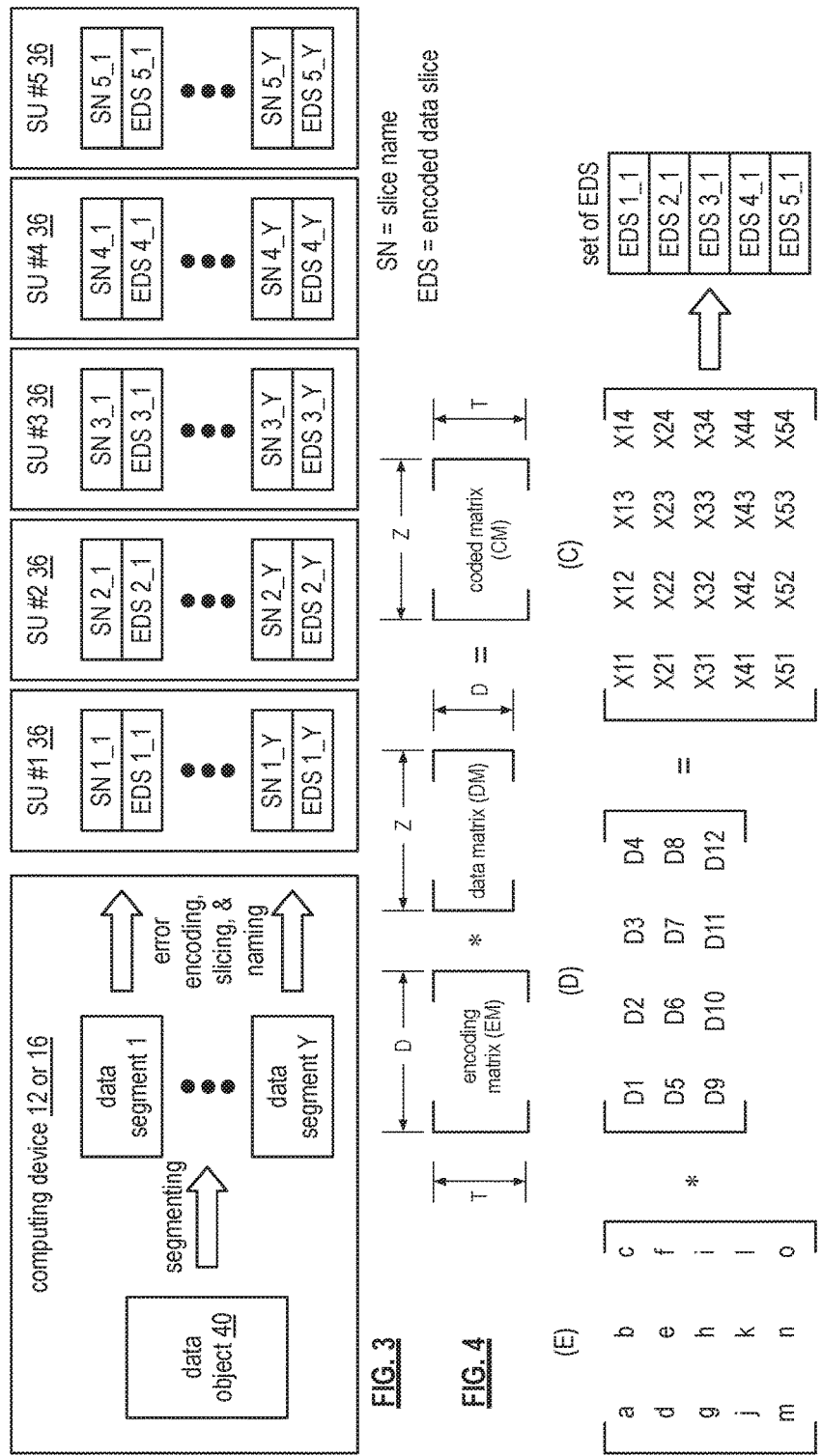

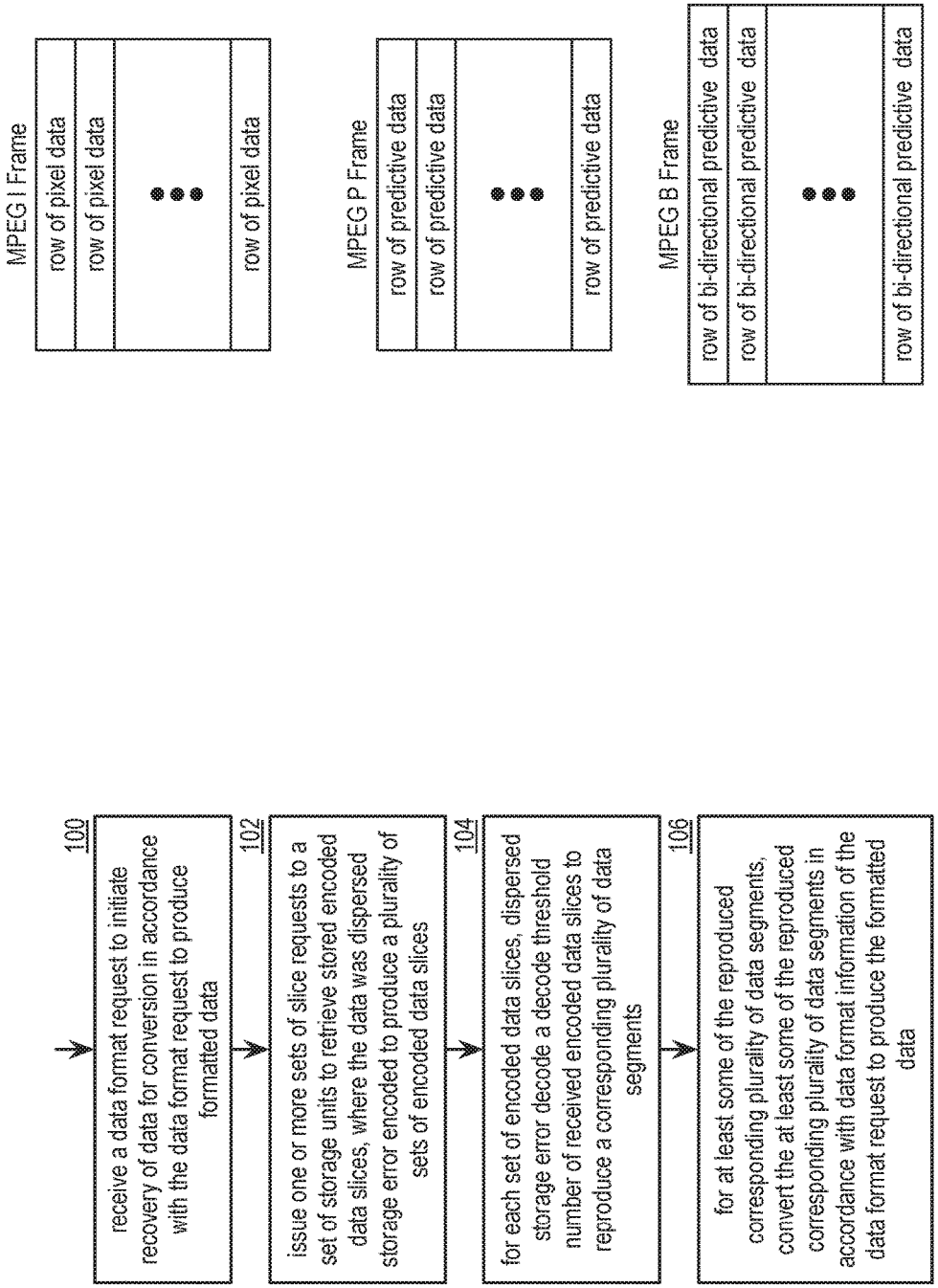

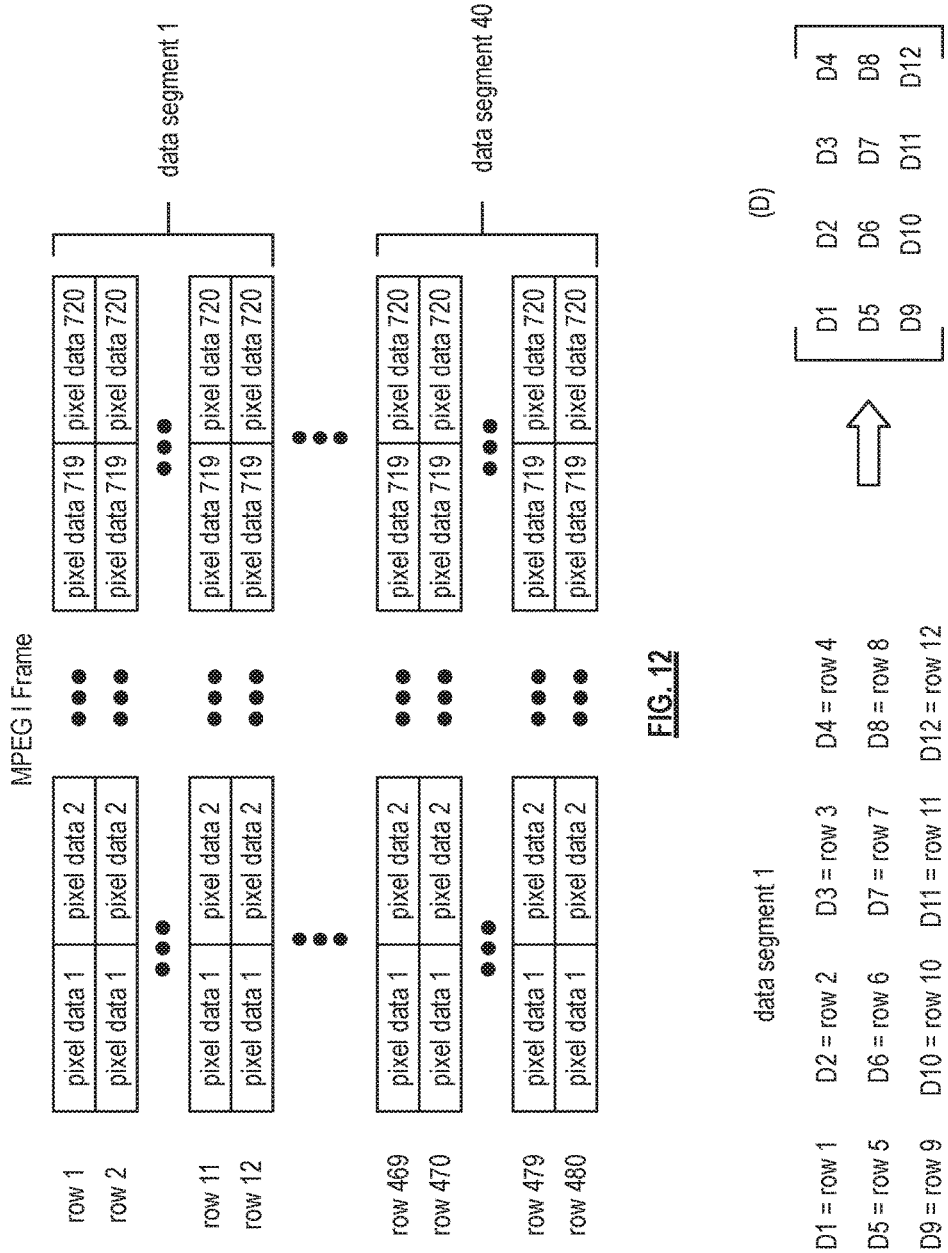

REQUESTER SPECIFIED TRANSFORMATIONS OF ENCODED DATA IN DISPERSED STORAGE NETWORK MEMORY

CROSS REFERENCE TO RELATED APPLICATIONS

The present U.S. Utility Patent Application claims priority pursuant to 35 U.S.C. § 119(e) to U.S. Provisional Application No. 62/260,743, entitled "COMMUNICATING DISPERSED STORAGE NETWORK STORAGE UNIT TASK EXECUTION STATUS", filed Nov. 30, 2015, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system in various formats (e.g., docx, Moving Picture Experts Group Layer-4 (MPEG-4), PDF, etc.). The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 10 is a flowchart illustrating an example of formatting recovered data in accordance with the present invention;

FIG. 11 is a schematic block diagram of video data in accordance with the present invention;

FIG. 12 is a schematic block diagram of grouping rows of pixel data in accordance with the present invention;

FIG. 13 is a schematic block diagram of a data matrix in accordance with the present invention.

DETAILED DESCRIPTION OF THE INVENTION

Figure 1:
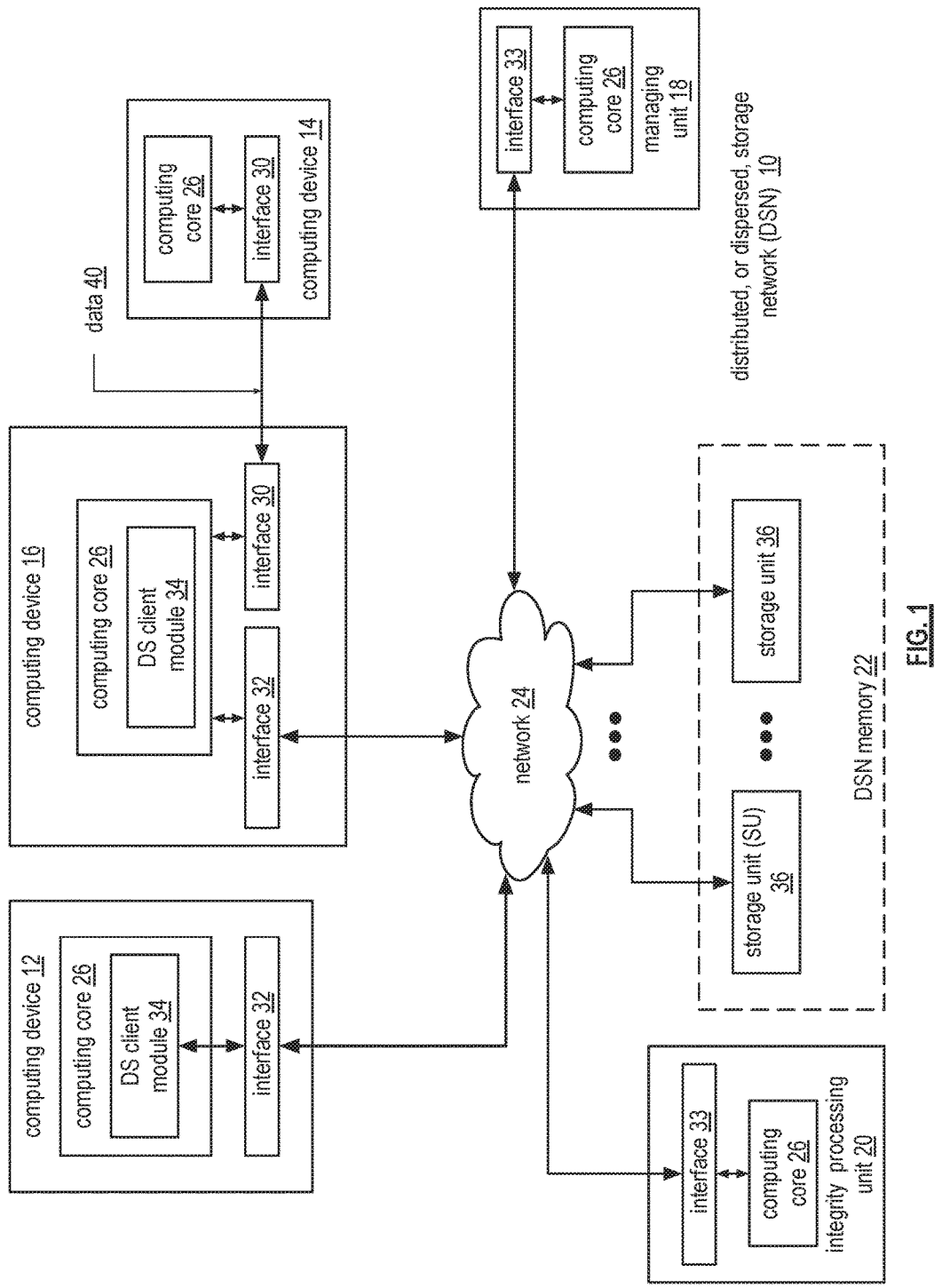
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
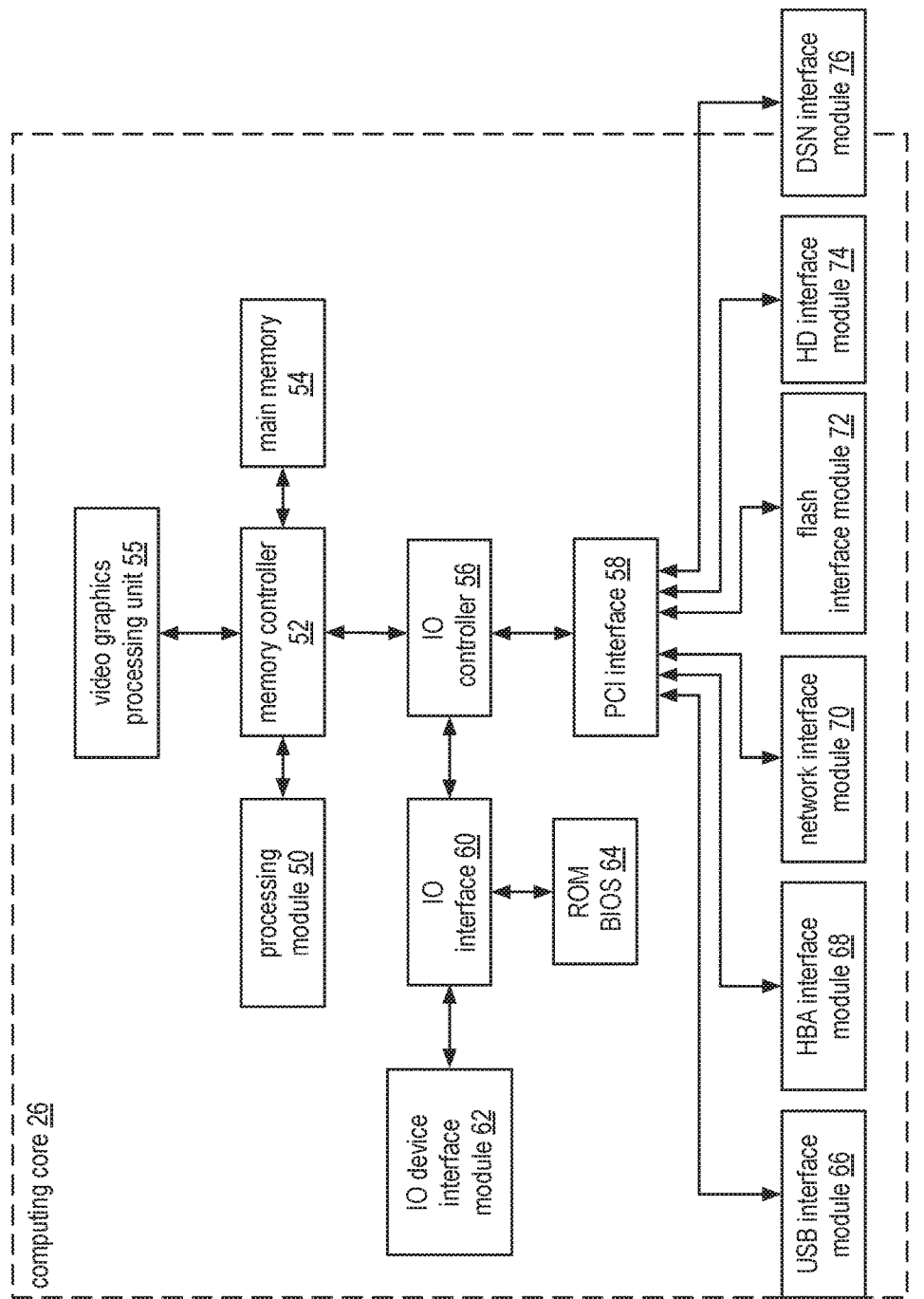
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
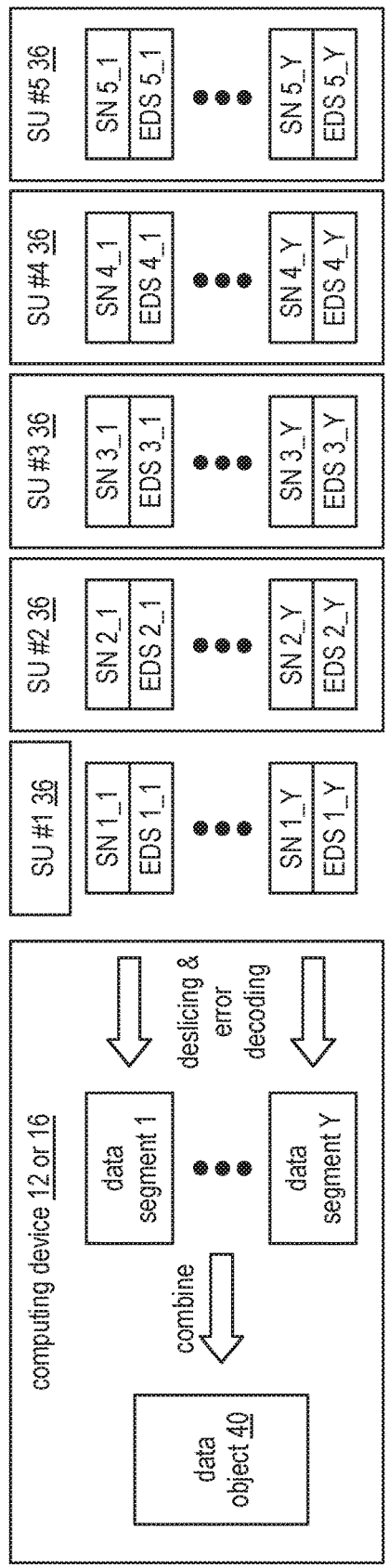
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
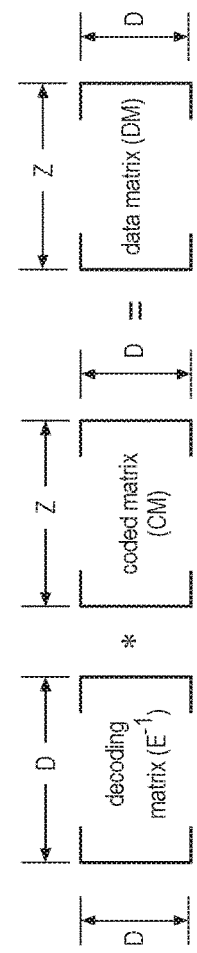
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
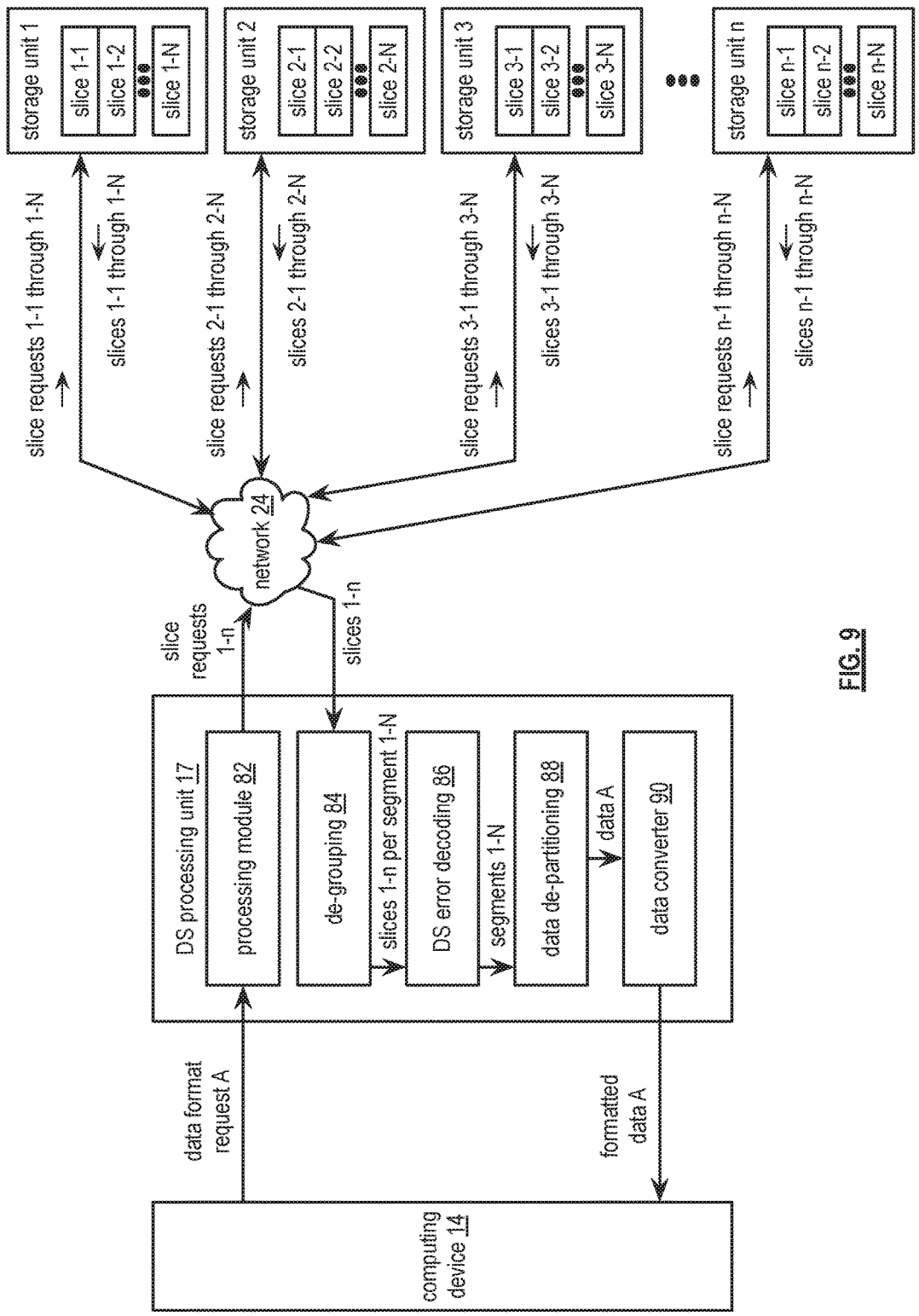
FIG. 9 is a schematic block diagram of another embodiment of a dispersed storage network (DSN) in accordance with the present invention.

FIG. 9 is a schematic block diagram of another embodiment of a dispersed storage network (DSN) that includes the computing device 14 of FIG. 1, a DS processing unit 17, the network 24 of FIG. 1, and a set of storage units 1-$n$. The DS processing unit 17 includes a processing module 82, a de-grouping 84, a dispersed storage (DS) error decoding 86, a data de-partitioning 88, and a data converter 90. The data converter 90 may be implemented utilizing one or more of the processing module 82 and the DS client module 34 of FIG. 1. The DSN functions to format recovered data.

In an example of operation of the formatting of the recovered data, the processing module 82 receives a data format request A from the computing device 14 to recover data and convert the recovered data into formatted data, where the data is dispersed storage error encoded (e.g., previously by the computing device 16 or another entity) to produce a plurality of N sets of encoded data slices that are stored in the set of storage units, and where the data format request includes one or more of a data identifier (ID), a data type indicator (e.g., document, image, video, sound, etc.), an expected data format, a desired data format (e.g., document type, video format, image format, another format), and a conversion option (e.g., docx, pdf, postscript, png, bmp, gif, jpeg, frame rate, video codec identifier, fidelity level, x-y dimensions, compression level, version number, etc.).

Having received the data format request A, the processing module 82 issues one or more sets of slice requests 1-n to the set of storage units to retrieve at least a decode threshold number of encoded data slices for each set of encoded data slices. For example, the processing module 82 generates the one or more sets of slice requests based on the data ID and sends, via the network 24, the one or more sets of slice requests to corresponding storage units of the set of storage units, i.e., slice requests 1-1 through 1-N to storage unit 1, etc.

The de-grouping 84 groups received encoded data slices into the at least a decode threshold number of encoded data slices for each of the sets of encoded data slices. For example, the de-grouping 84 interprets slice names of the received slices and lines the decode threshold number of slices by segment numbers of the slice names, i.e., slices for segment 1, slices for segment 2, through slices for segment N.

The DS error decoding 86, for each set of encoded data slices, dispersed storage error decodes the received decode threshold number of encoded data slices to reproduce a data segment of data segments 1-N. The data de-partitioning 88 aggregates the N data segments to reproduce data A. For example, the data de-partitioning 88 combines reproduced data segments sequentially to reproduce the data A. As another example, the data de-partitioning 88 combines the reproduced data segments in an order based on the data format request A.

With the data A reproduced, the data converter converts the reproduced data A in accordance with the data format request to produce the formatted data A. For example, the data converter identifies the desired data format and conversion option of the data format request, processes the reproduced data A in accordance with the identified desired data format and conversion option to produce the formatted data A, and sends the formatted data A to the computing device 14.

As a specific example, the computing device includes a video decoder and requests data in a video format (e.g., Moving Pictures Expert Group 4 (MP4), Audio Video Interleave (AVI), Flash Video Format (FLV), Apple QuickTime Movie (MOV), etc.). As another specific example, the computing device includes an audio decoder and requests data in an audio format (e.g., Waveform Audio File Format (WAV), MPEG-1 Audio Layer 3 (MP3), Apple Lossless Audio Codec (ALAC), etc.).

FIG. 10 is a flowchart illustrating an example of formatting recovered data. The method includes step 100 where a processing module (e.g., of a distributed storage and task (DST) processing unit) receives a data format request to initiate recovery of data for conversion in accordance with the data format request to produce formatted data. The data format request includes one or more of a data identifier, a data type indicator, an expected data format, a desire data format, and a conversion option.

The method continues at step 102 where the processing module issues one or more sets of slice requests to a set of storage units to retrieve stored encoded data slices, where the data was dispersed storage error encoded to produce a plurality of sets of encoded data slices. The issuing includes generating one or more sets of slice requests based on the data identifier and sending the one or more sets of slice requests to corresponding storage units of the set of storage units.

For each set of encoded data slices, the method continues at step 104 where the processing module dispersed storage error decodes a decode threshold number of received encoded data slices to reproduce a corresponding data segment of a plurality of data segments. The decoding includes one of combining decoded segments sequentially and combining decoded segments in an order based on the data format request.

For at least some of the reproduce corresponding plurality of data segments, the method continues at step 106 where the processing module converts the at least some of the reproduced corresponding plurality of data segments in accordance with data format information of the data format request to produce the formatted data. For example, the processing module identifies the desire data format and conversion option of the data format request, processes the reproduced data segments in accordance with the identified desired data format and conversion option to produce the formatted data (e.g., one segment a time, of segments together, as one data block that includes all of the data segments), and sends the formatted data to a requesting entity.

FIG. 11 is a schematic block diagram of video data. In this example, the video data includes frames that are stored as encoded data slices in a set of storage units. The frames include MPEG I-Frames, P-Frames and B-Frames. The I-Frames contain macroblocks are coded without prediction and are stored as rows of pixel data in the set of storage units. The P-Frames contain macroblocks coded with forward prediction and are stored as rows of predictive data in the set of storage units. The B-Frames are coded with one or more of forward, backward, interpolated and no prediction and are stored as rows of bi-directional predictive data in the set of storage units. Note that other formats of video data may be stored. For example, in the H.264/MPEG-4 AVC standard, a spatially distinct region of a frame that is encoded separately from any other region in the same frame is called a slice, thus the set of storage units would also store I-slices, P-slices, and B-slices as encoded data slices.

As an example, the computing device 14 includes a video encoder (e.g., DivX) and requests formatted data from a DS processing unit 17 to be received from in a video format (e.g., MPEG). The DS processing unit 17 sends slice requests to storage units for the video data and receives at least a decode threshold number of encoded data slices. The decode threshold number of encoded data slices are then de-grouped, DS error decoded, data de-partitioned and converted by data converter 90 into formatted (e.g., MPEG) video data. The formatted video data is then sent to the computing device 14.

FIG. 12 is a schematic block diagram of grouping rows of pixel data of an MPEG I-Frame into data segments. Data segments 1-40 store the MPEG I-Frame as encoded data slices in a set of storage units. In this example, each data segment includes portions (e.g., rows) of pixel data. For example, data segment 1 stores rows 1-12 of I-Frame pixel data 1-720 up to data segment 40 which stores rows 469-480 of I-Frame pixel data 1-720. The MPEG P-Frames and B-Frames of FIG. 11 may also be stored by grouping rows of data (e.g., predictive, bi-directional predictive, etc.). Note that grouping of rows is only an example and other groupings may also be used (e.g., sub-row, sub-column, etc.). For example, columns (e.g., rows 1-480) of pixel data are grouped into data segments. In this example, data segment 1 stores rows 1-480 of pixel data 1-10, data segment 2 stores rows 1-480 of pixel data 11-20, and so on up to data segment 48 stores rows 1-480 of pixel data 711-720.

FIG. 13 is a schematic block diagram of a data matrix. For example, the data matrix (D) includes blocks of data D1-D12, where each block of data D1-D12 represents a corresponding row of pixel data of the MPEG I-Frame. The data matrix (D) is then multiplied by an encoding matrix as shown in FIG. 5 to produce coded data and is then stored as encoded data slices in a set of storage unit of the DSN. Note the data blocks (D1-D12) may be arranged in other configurations to create a desired data matrix.

Figure 14:
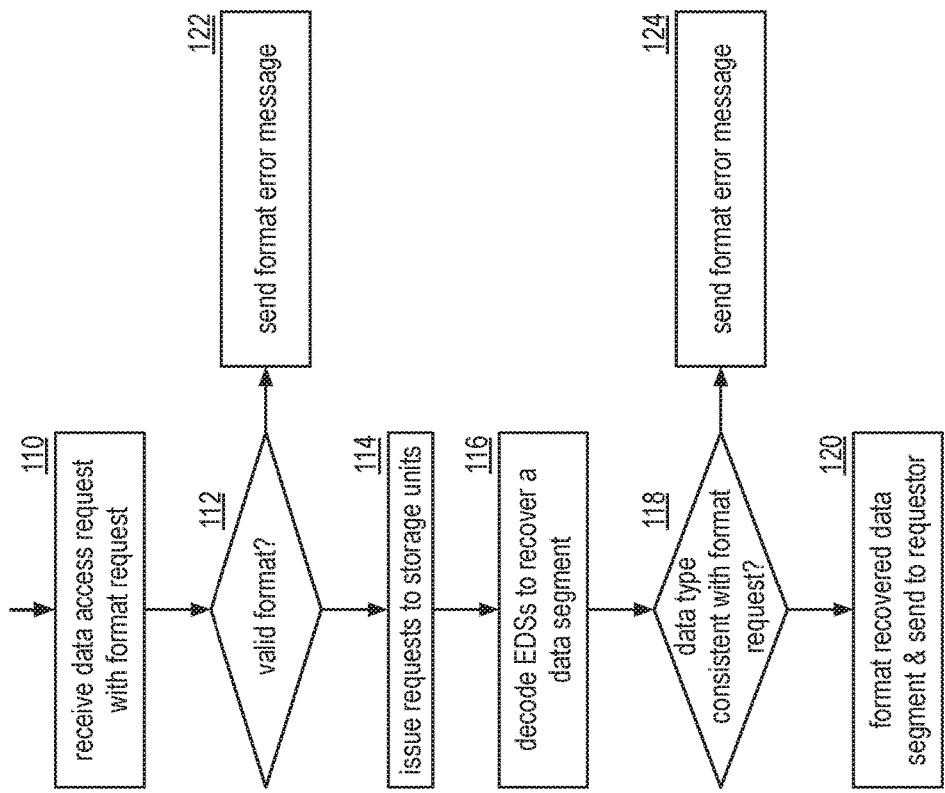
FIG. 14 is a flowchart illustrating an example of receiving a data access request that includes a requested return data format in accordance with the present invention.

FIG. 14 is a flowchart illustrating an example of receiving a data access request that includes a requested return data format. The method for execution by a computing device of a dispersed storage network (DSN) begins with step 110, where the computing device receives, from a requesting device of the DSN, a data access request regarding a set of encoded data slices, wherein the data access request includes a requested return data format. For example, the requested return data format includes one of word processing document, Portable Document Format (PDF), and postscript when the recovered data segment is a portion of text file, the requested return data format includes one of Portable Network Graphics (PNG), Bitmap (BMP), Graphics Interchange Format (GIF), and Joint Photographic Experts Group (JPEG) when the recovered data segment is a portion of an image file, the requested data format includes one of Moving Picture Experts Group Layer-3 Audio (MP3), Waveform Audio File (WAVE), Advanced Audio Coding (AAC), and Windows Media Audio (WMA) when the recovered data segment is a portion of an audio file, and the requested data format includes one of Moving Picture Experts Group (MPEG), Moving Picture Experts Group 4 Part 10 Advanced Video Coding (MPEG-4 AVC), and Windows Media Video (WMV) when the recovered data segment is a portion of a video file. As another example, the requested return data format may also include one or more of a frame rate, a fidelity level, x-y dimensions, compression level, and version number.

The method continues with step 112, where the computing device determines whether the requested return data format is a valid format. For example, the computing device determines whether the requested return data format is the valid format by at least one of, determining whether the requested return format is on a list of format options capable of being performed by the computing device and determining whether the requested return format is a standardized format.

When the requested return data format is an invalid format, the method continues at step 122, where the computing device sends a format request error message to the requesting device. When the requested return data format is the valid format, the method continues at step 114, where the computing device issues data access requests to storage units of the DSN, wherein a set of storage units stores the set of encoded data slices and the set of storage units includes the storage units. When a decode threshold number of encoded data slices of the set of encoded data slices have been received from the storage units, the method continues at step 116 where the computing device decodes the decode threshold number of encoded data slices to recover a data segment.

The method continues at step 118, where the computing device determines whether a data type of the data segment is consistent with the requested return data format. For example, the computing device determines whether the data type of the data segment is consistent with the requested return data format by one or more of, determining the data type to be text and verifying that the requested return data format is a text format, determining the data type to be video and verifying that the requested return data format is a video format, determining the data type to be audio and verifying that the requested return data format is an audio format, and determining the data type to be an image and verifying that the requested return data format is an image format.

When the data type of the data segment is inconsistent with the requested returned data format, the method continues to step 124, where the computing device sends a format request error message to the requesting device. When the data type of the data segment is consistent with the requested returned data format, the method continues at step 120, where the computing device formats the recovered data segment in accordance with the requested return data format and sends the formatted and received data segment to the requested device.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a computing device of a dispersed storage network (DSN), the method comprises:
   receiving, from a requesting device of the DSN, a data access request regarding a set of encoded data slices, wherein the data access request includes an expected data format, a requested return data format, and a conversion option, and wherein a data segment of data is dispersed storage error encoded to produce the set of encoded data slices;
   determining whether the computing device is capable of processing the data segment into the requested return data format, wherein the determination is based on the requested return data format being on a list of format options capable of being performed by the computing device;
   when the computing device is capable of processing the data segment into the requested return data format:
      issuing data access requests to storage units of the DSN, wherein a set of storage units stores the set of encoded data slices and the set of storage units includes the storage units;
      when a decode threshold number of encoded data slices of the set of encoded data slices have been received from the storage units, decoding the decode threshold number of encoded data slices to recover the data segment in a DSN format;
      determining whether a data type of the data segment is consistent with the expected data format;
      when the data type of the data segment is consistent with the expected data format, formatting the recovered data segment in accordance with the requested return data format and the conversion option to produce a formatted and recovered data segment; and
      sending the formatted and recovered data segment to the requesting device.

2. The method of claim 1, wherein the expected data format is the same format as the requested return data format.

3. The method of claim 1 further comprises:
   when the computing device is not capable of processing the data segment into the requested return data format, sending a format request error message to the requesting device.

4. The method of claim 1, wherein the determining whether the data type of the data segment is consistent with the expected data format comprises one or more of:
   determining the data type to be text and verifying that the expected data format is a text format;
   determining the data type to be video and verifying that the expected data format is a video format;
   determining the data type to be audio and verifying that the expected data format is an audio format; and
   determining the data type to be an image and verifying that the expected data format is an image format.

5. The method of claim 1 further comprises:
   when the data type of the data segment is inconsistent with the expected data format, sending a format request error message to the requesting device.

6. The method of claim 1 further comprises:
   the requested return data format including one of a word processing document, Portable Document Format (PDF), and postscript when the recovered data segment is a portion of text file;
   the requested return data format including one of Portable Network Graphics (PNG), bitmap (BMP), Graphics Interchange Format (GIF), and Joint Photographic Experts Group (JPEG) when the recovered data segment is a portion of an image file;
   the requested return data format including one of Moving Picture Experts Group Layer-3 Audio (MP3), Waveform Audio File (WAVE), Advanced Audio Coding (AAC), and Windows Media Audio (WMA) when the recovered data segment is a portion of an audio file; and
   the requested return data format including one of Moving Picture Experts Group (MPEG), Moving Picture Experts Group 4 Part 10 Advanced Video Coding (MPEG-4 AVC), and Windows Media Video (WMV) when the recovered data segment is a portion of a video file.

7. The method of claim 1, wherein the conversion option comprises one or more of:
   a data format;
   a video codec identifier;
   a frame rate;
   a fidelity level;
   x-y dimensions;
   compression level; and
   version number.

8. A computing device of a dispersed storage network (DSN), the computing device comprises:
   an interface;
   memory;
   a processing module operably coupled to the memory and the interface, wherein the processing module is operable to:
   receive, via the interface, from a requesting device of the DSN, a data access request regarding a set of encoded data slices, wherein the data access request includes an expected data format, a requested return data format, and a conversion option, and wherein a data segment of data is dispersed storage error encoded to produce the set of encoded data slices;
   determine whether the computing device is capable of processing the data segment into the requested return data format, wherein the determination is based on the requested return data format being on a list of format options capable of being performed by the computing device;
   when the computing device is capable of processing the data segment into the requested return data format:
      issue data access requests to storage units of the DSN, wherein a set of storage units stores the set of encoded data slices and the set of storage units includes the storage units;
      when a decode threshold number of encoded data slices of the set of encoded data slices have been received from the storage units, decode the decode threshold number of encoded data slices to recover the data segment in a DSN format;
      determine whether a data type of the data segment is consistent with the expected data format;
      when the data type of the data segment is consistent with the expected data format, format the recovered data segment in accordance with the requested return data format and the conversion option to produce a formatted and recovered data segment; and send, via the interface, the formatted and recovered data segment to the requesting device.

9. The computing device of claim 8, wherein the expected data format is the same as the requested return data format.

10. The computing device of claim 8, wherein the processing module is further operable to:
when the computing device is not capable of processing the data segment into the requested return data format, send, via the interface, a format request error message to the requesting device.

11. The computing device of claim 8, wherein the processing module is operable to determine whether the data type of the data segment is consistent with the expected data format by one or more of:
determining the data type to be text and verifying that the expected data format is a text format;
determining the data type to be video and verifying that the expected data format is a video format;
determining the data type to be audio and verifying that the expected data format is an audio format; and
determining the data type to be an image and verifying that the expected data format is an image format.

12. The computing device of claim 8 further comprises:
when the data type of the data segment is inconsistent with the expected data format, send, via the interface, a format request error message to the requesting device.

13. The computing device of claim 8 further comprises:
the requested return data format including one of a word processing document, Portable Document Format (PDF), and postscript when the recovered data segment is a portion of text file;
the requested return data format including one of Portable Network Graphics (PNG), bitmap (BMP), Graphics Interchange Format (GIF), and Joint Photographic Experts Group (JPEG) when the recovered data segment is a portion of an image file;
the requested return data format including one of Moving Picture Experts Group Layer-3 Audio (MP3), Waveform Audio File (WAVE), Advanced Audio Coding (AAC), and Windows Media Audio (WMA) when the recovered data segment is a portion of an audio file; and
the requested return data format including one of Moving Picture Experts Group (MPEG), Moving Picture Experts Group 4 Part 10 Advanced Video Coding (MPEG-4 AVC), and Windows Media Video (WMV) when the recovered data segment is a portion of a video file.

14. The computing device of claim 8, wherein the conversion option comprises one or more of:
a data format;
a video codec identifier;
a frame rate;
a fidelity level;
x-y dimensions;
compression level; and
version number.

* * * * *